United States Patent [19]

Wong

[11] Patent Number: 5,719,521

[45] Date of Patent: Feb. 17, 1998

[54] INTEGRATED HALF-BRIDGE TIMING CONTROL CIRCUIT

[75] Inventor: Stephen L. Wong, Scarsdale, N.Y.

[73] Assignee: Philips Electronics North America Corporation, New York, N.Y.

[21] Appl. No.: 741,163

[22] Filed: Oct. 29, 1996

[51] Int. Cl.$^6$ ............................................. H03K 3/00
[52] U.S. Cl. .................... 327/434; 327/108; 327/382; 327/387
[58] Field of Search ................... 327/108–112, 182, 327/239, 258, 259, 261, 263, 264, 285, 288, 379, 382, 387, 388, 423, 424, 434, 436, 437

[56] References Cited

U.S. PATENT DOCUMENTS

| | | | |
|---|---|---|---|
| 4,942,309 | 7/1990 | Chieli | 327/109 |
| 5,134,322 | 7/1992 | Bourgeois et al. | 327/381 |
| 5,502,412 | 3/1996 | Choi et al. | 327/333 |
| 5,543,740 | 8/1996 | Wong | 327/108 |
| 5,552,731 | 9/1996 | Diazzi et al. | 327/109 |
| 5,572,156 | 11/1996 | Diazzi et al. | 327/109 |
| 5,594,379 | 1/1997 | Kiraly | 327/381 |

FOREIGN PATENT DOCUMENTS 2-281813A  11/1990  Japan .

*Primary Examiner*—Timothy P. Callahan
*Assistant Examiner*—Kenneth B. Wells
*Attorney, Agent, or Firm*—Steven R. Biren

[57] ABSTRACT

An integrated half-bridge timing control circuit for driving a half-bridge output stage has high-side and low-side power transistors coupled together at a high-voltage output terminal, and a bistable circuit for generating a high-side timing control waveform. The bistable circuit is driven by two delay circuits, each of which is decoupled from the high-side voltage by an associated interface circuit. The interface circuits are driven by input voltages which are delayed with respect to each other and which are referenced to the low side (ground). In this manner, an integrated half-bridge timing control circuit is obtained which is capable of operating at high frequencies with little power loss, which can be easily integrated, and which is both accurate and easily adjustable in operation.

10 Claims, 2 Drawing Sheets

INTEGRATED HALF-BRIDGE TIMING CONTROL CIRCUIT

BACKGROUND OF THE INVENTION

This invention is in the field of half-bridge driver control circuits, and relates more particularly to integrated half-bridge timing control circuits capable of operating at relatively high frequencies.

Half-bridge driver circuits are presently used to drive power transistors in such applications as power converters in electronic ballasts for high intensity discharge lamps and induction lamps. Although present electronic ballast circuits operate at relatively low frequencies, typically up to several hundred KHz, electronic ballasts currently under development for high intensity discharge lamps will be required to operate at frequencies of over 700 KHz, with electronic ballasts for induction lamps requiring operation at frequencies up to several MHz. For such applications, the use of existing half-bridge driver circuits in the power converters of the electronic ballasts is impractical, because present integrated circuit designs generate high losses and excessive heat at high frequencies, which in practice limits high-voltage high-frequency operation.

A representative prior-art integrated driver circuit is the IR2110, manufactured by International Rectifier. This high-voltage integrated circuit uses a bootstrap capacitor to power the high-side gate drive circuit, which is fabricated in a floating well within the IC. Timing information from a low-voltage control circuit is communicated to the circuitry within the floating well by a level-shifting stage that operates off the high voltage and sends pulses of current to a latch circuit in the floating well. The state of the latch circuit then determines when the high-side power transistor is turned on and off. However, the use of a level shifting stage operating off the high voltage, while effective to transmit timing information to the high-side switch, is a major source of power loss at high frequencies, and in practice limits the frequency of operation of such circuits to about 100 KHz.

An integrated half-bridge driver circuit in which power losses due to dissipation in the level shifting circuitry are minimized or eliminated, and which is capable of operating at frequencies substantially higher than the maximum operating frequency of presently-available integrated driver circuits, is shown in my earlier U.S. Pat. No. 5,543,740, incorporated herein by reference in its entirety.

However, this prior-art integrated half-bridge driver circuit still has a number of drawbacks. By using bootstrap capacitors to store analog voltages which in turn get converted into timing information as a function of a decaying analog voltage, accuracy problems can ensue in the analog-to-digital conversion process. Additionally, parasitic capacitances can have an adverse effect on circuit timing accuracy, unless the bootstrap capacitors are made very large, in which case integration becomes impractical or even impossible.

Accordingly, it would be desirable to have an integrated half-bridge timing control circuit which offers little power loss, even at high frequencies. Additionally, the driver circuit should not require the use of large capacitors or sophisticated analog circuits, so that it can be easily integrated. Finally, the driver circuit should offer flexibility in operation, with both the duty cycle and period of the timing control circuit being selectable.

SUMMARY OF THE INVENTION

It is thus an object of the invention to provide an integrated half-bridge timing control circuit in which power loss is minimized, even at higher frequencies. It is a further object of the invention to provide an integrated half-bridge timing control circuit which avoids the use of large capacitors and sophisticated analog circuits, so that it may be easily integrated. Yet a further object of the invention is to provide an integrated half-bridge timing control circuit in which the duty cycle and period can be selected, for flexible operation.

In accordance with the invention, these objects are achieved by a new integrated half-bridge timing control circuit for driving a half-bridge output stage having high-side and low-side power transistors coupled together at a high-voltage output terminal. The driver circuit includes a bistable circuit for generating a high-side timing control waveform and having set and reset inputs and an output coupled to a control terminal of the high-side power transistor. A first delay circuit is referenced to the low side (ground) and has an input coupled to an input of the timing control circuit and an output. A second delay circuit is provided having an input and an output coupled to the bistable circuit set input, and a first interface circuit is provided for coupling the first delay circuit output to the second delay circuit input. Additionally, a third delay circuit is provided having an input and an output coupled to the bistable circuit reset input, and a second interface circuit is provided for coupling the timing control circuit input to the third delay circuit input.

In a preferred embodiment of the invention, the first delay circuit is a controllable delay circuit and the second and third delay circuits are fixed delay circuits.

In a further preferred embodiment of the invention, the integrated half-bridge timing control circuit also includes a further bistable circuit for generating a low-side timing control waveform and having set and reset inputs and an output coupled to a control terminal of the low-side power transistor, with the first delay circuit output being coupled to the further bistable circuit reset input, and a further delay circuit being coupled between the timing control circuit input and the further bistable circuit set input.

In this manner, an integrated half-bridge timing control circuit is obtained which is capable of operating at high frequencies with low power loss, which is easily integrated, and in which the duty cycle and period of the half-bridge circuit can be varied.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

DESCRIPTION OF THE PREFERRED EMBODIMENTS

Figure 1:
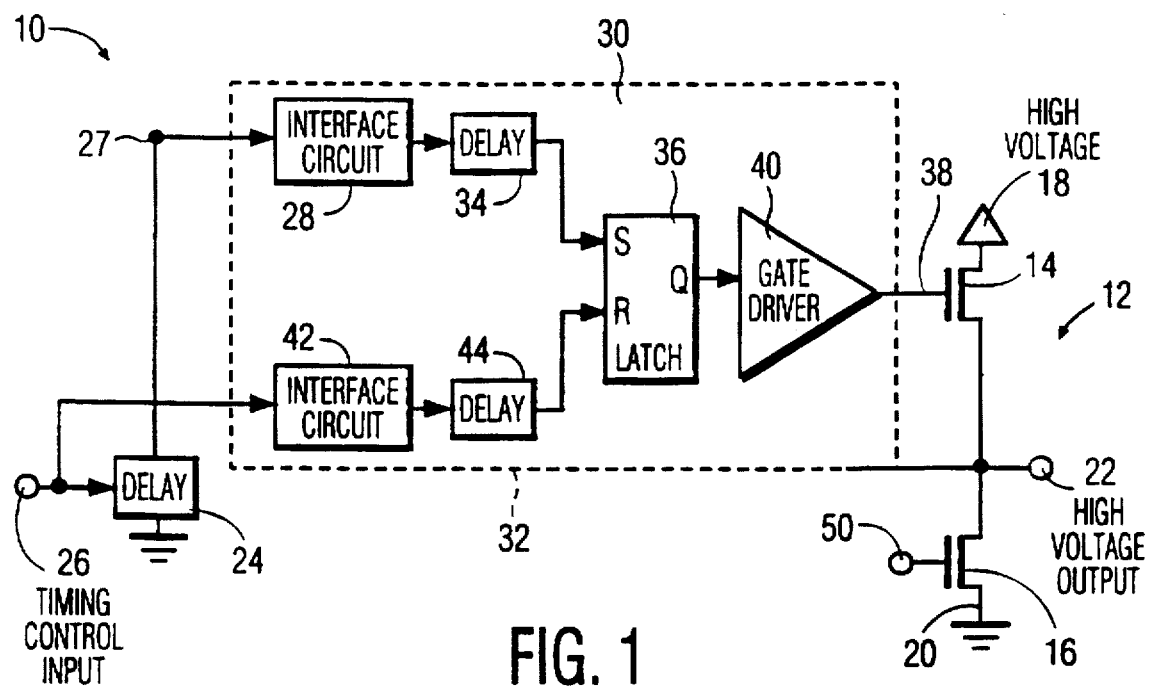
FIG. 1 shows a block diagram of an integrated half-bridge timing control circuit in accordance with the invention.

An integrated half-bridge timing circuit 10 in accordance with the invention is shown in block-diagram form in FIG.

1. This circuit is used for driving a half-bridge output stage 12 having high-side and low-side power transistors 14 and 16, respectively, together between a high-voltage terminal 18 and a common or ground node 20 at a high-voltage output terminal 22.

The timing circuit 10 further includes a low-voltage first delay circuit 24 referenced to the low side (ground) and having a timing control circuit input terminal 26 and an output 27 which is coupled to a first interface circuit 28 within a floating well 30, the latter being denoted by the dashed rectangle in FIG. 1. It should be understood that the term "floating well", as used herein, designates a portion of an integrated circuit which is electrically "floating" with respect to other portions of the same integrated circuit, so that both its voltage supply and common or ground connections can "float" or vary with respect to the voltage supply and ground connections for the remainder of the integrated circuit, in a manner well known to those of ordinary skill in this art. Thus, circuits such as interface circuit 28 in the floating well 30 are coupled between a floating voltage supply line (not shown in this figure for simplicity) and a floating ground node (schematically shown as horizontal dashed line 32) which is connected to high-voltage output terminal 22. Circuits such as interface circuit 28 in the floating well 30 are powered by a floating voltage supply which is coupled between the floating voltage supply line connected to the circuits in the well and floating ground node 32.

The output of the first interface circuit 28 is coupled to an input of a second delay circuit 34, the output of which is coupled in turn to a set input S of a latch circuit (or other suitable bistable circuit) 36. An input Q of the latch circuit 36 provides a high-side timing control waveform which is coupled to a gate terminal 38 of high-side power transistor 14 by a gate driver circuit 40 or other suitable coupling means.

The timing control circuit input terminal 26 is also coupled to an input of a second interface circuit 42, the output of which is coupled to an input of a third delay circuit 44. An output of delay circuit 44 is in turn coupled to a reset input R of the latch 36. It will be appreciated that circuits such as the latch circuit 36 within the floating well 30 are powered by a floating low-voltage power supply which is referenced to the floating ground node shown schematically by the dashed line 32 in FIG. 1.

Figure 2:
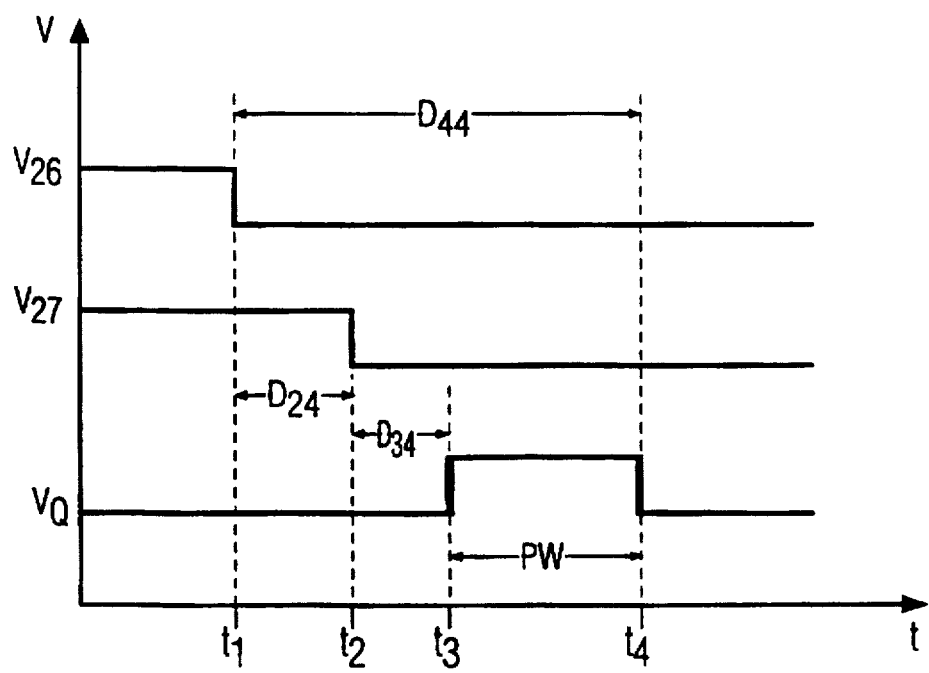
FIG. 2 shows selected voltage waveforms generated during the operation of the circuit shown in FIG. 1.

The operation of the circuit of FIG. 1 may be more easily understood with reference to the timing diagram of FIG. 2. In FIG. 2, the first two waveforms $V_{26}$ and the $V_{27}$ refer to the voltages at timing control input terminal 26 and node 27, respectively, while the time intervals $D_{24}$ and $D_{44}$ refer to the time delays of delay circuits 24 and 44, respectively. The triggering point for generating the output voltage $V_Q$ of latch circuit 36 is the falling edge of the waveform $V_{26}$ at time $t_1$. As shown in FIG. 2, the falling edges of $V_{26}$ and $V_{27}$ are separated by the time delay $D_{24}$, and occur during a period when the output of the half-bridge circuit is low and when the floating well 30 is accordingly still near ground potential. The ground-referenced voltages $V_{26}$ and $V_{27}$ are coupled to delay circuits 34 and 44 within the floating well by interface circuits 28 and 42, respectively, resulting in set (S) and reset (R) inputs to latch 36 which cause its output $V_Q$ to rise at time $t_3$, which occurs at a delay equal to the sum of $D_{24}$ and $D_{34}$ after time $t_1$, and fall at a time $t_4$, which occurs at a time delay $D_{44}$ after time $t_1$. Thus, the pulse width PW of voltage $V_Q$ has both its rising and falling edges controlled from a single falling edge of waveform $V_{26}$ in combination with delay circuits 24, 34 and 44. Furthermore, since delay circuit 24 is referenced to ground, its delay can be easily controlled by circuit adjustment, so that a desired pulse width PW can be obtained by selecting an appropriate value for delay $D_{24}$, while the delay circuits 34 and 44, in the floating well, retain a fixed delay.

Figure 3:
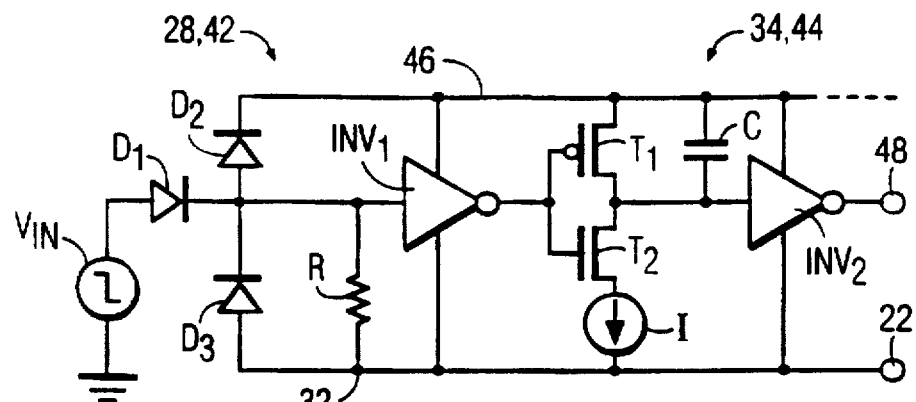
FIG. 3 shows a schematic diagram of an interface and delay circuit for use in the half-bridge timing control circuit of FIG. 1.

While it will be recognized that many forms of interface circuits (28, 42) and delay circuits (34, 44) may be used, one advantageous implementation of such circuits is shown in FIG. 3. In FIG. 3, an interface circuit such as circuit 28 or 42 in FIG. 1 is coupled to a delay circuit such as delay 34 or 44 in FIG. 1, with the interface and delay circuits being connected between floating ground 32 and a power supply bus 46 which is at a voltage equal to the desired power supply voltage for the circuits of FIG. 3 above the potential of the floating ground 32. The interface portion of the circuit includes a diode $D_1$ for coupling an input voltage $V_{IN}$ to a pair of series-connected diodes $D_2$ and $D_3$, a resistor R and an inverter $INV_1$. This portion of the circuit serves to couple the ground-referenced voltage $V_{IN}$, (which may be the voltage at either node 26 or node 27 in FIG. 1) up to the delay circuit in the floating well which is referenced to the floating ground 32. For this purpose, diode $D_1$ must be a high-voltage diode, to withstand the high voltages that will occur between ground and the floating well during a portion of the operating cycle of the circuit. Due to the particular circuit configuration of the interface circuit 28, 42, the state of the logical input provided to the delay circuit 34, 44 will remain unchanged during changes in voltage level in the floating well.

FIG. 3 also illustrates one particular implementation of a delay circuit 34, 44, although it will be appreciated that many different delay circuit configurations can be employed. In this circuit, the output of inverter $INV_1$ is fed to a pair of MOSFET transistors $T_1$ and $T_2$ connected in series with a current source I, which serves to charge a capacitor C, with the delay time being the time needed for the capacitor C to be charged by the current source I from zero to the threshold voltage of a subsequent inverter $INV_2$. The output of the inverter $INV_2$, at terminal 48, is then coupled to either the set input (for delay circuit 34) or the reset input (for delay circuit 44) of latch circuit 36 in FIG. 1.

Figure 4:
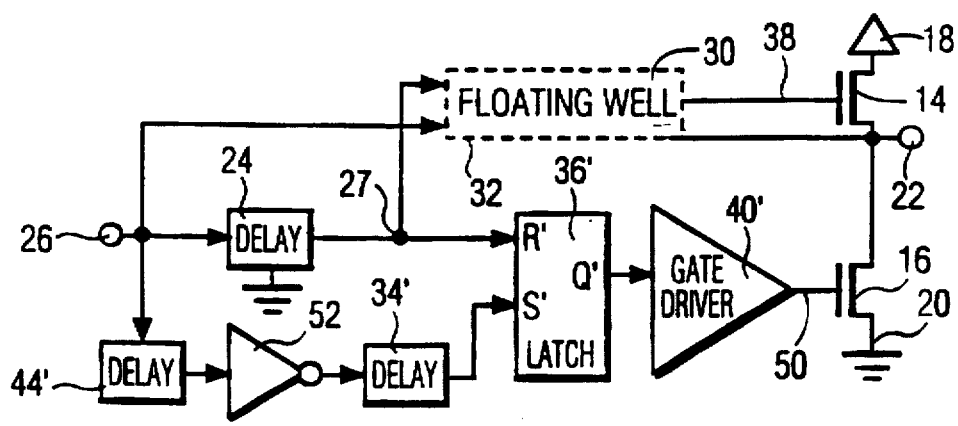
FIG. 4 shows a block diagram of a low-side control circuit for use in conjunction with the timing control circuit of FIG. 1.

A circuit suitable for cooperating with the circuit of FIG. 1 to synchronize the high-side gate signal to transistor 14 with the low-side gate signal to transistor 16 is shown in FIG. 4. The additional circuitry, shown in block-diagram form in FIG. 4, uses the signals present at the input (26) and output (27) of the delay circuit 24 to generate a low-side gate timing signal for the low-side gate 50 which is synchronized with the signal applied from latch 36 output Q through gate driver 40 in the floating well 30 to the high-side gate 38. This accomplished by applying the timing control input signal at terminal 26 to a pair of delay elements 44' and 34' which are connected in series with an inverter 52, with the output of delay element 34' being applied to the set input S' of latch 36'. The reset input R' of latch 36' receives an input from the output 27 of delay element 24. As in the previously-described circuitry, the output Q' of latch 36' is coupled to the input of gate driver 40', the output of which provides a timing signal at the gate 50 of low-side transistor 16. It should be noted that the delays of delay elements 44' and 34' are each set to be substantially equal to the delays of the delay circuits 44 and 34, respectively, in order to synchronize the timing of the low side with that of the high side.

Figure 5:
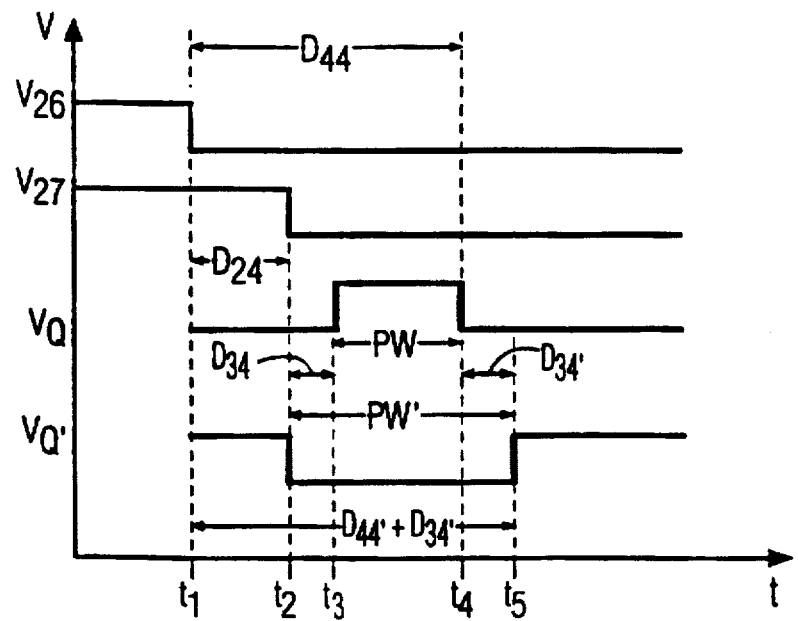
FIG. 5 shows selected voltage waveforms generated during the operation of the circuit shown in FIG. 4.

This synchronization is necessary in order to avoid any overlap in activation of the high-side and low-side transistors, which would result in an undesirable and possible damaging current surge between the high-voltage terminal 18 and the ground terminal 20. The manner in which this synchronization is achieved may be better understood with reference to FIG. 5, which shows a timing diagram of selected waveforms associated with the operation of the circuit of FIG. 4. In FIG. 5, the first three waveforms ($V_{26}$, $V_{27}$ and $V_Q$) correspond to the waveforms shown and described in connection with FIG. 2, with the portion of waveform $V_Q$ labelled PW and occurring between time $t_3$ and $t_4$ representing the pulse width of the signal applied through gate driver 40 to activate the high-side transistor 14. The fourth line of FIG. 5 represents the output $V_{Q'}$ of latch 36' which drives the gate of low-side transistor 16 through gate driver 40'. The voltage $V_{Q'}$ goes low at time $t_2$, when latch 36' is reset by the falling edge of voltage $V_{27}$ from delay element 24. Voltage $V_{Q'}$ then stays low until time $t_5$, which occurs at a delay equal to the sum of the delays provided by delay circuits 44' and 34' in FIG. 4. Thus, as clearly shown in FIG. 5, high-side transistor 14 is on for the duration "PW", between time $t_3$ and $t_4$, while low-side transistor 16 is off for the duration PW', between time $t_2$ and $t_5$. Since $t_2$ occurs before $t_3$ and $t_5$ occurs after $t_4$, as determined by the delays $D_{34}$ and $D_{34'}$, the low-side transistor 16 is always off from slightly before the high-side transistor turns on until slightly after the high-side transistor turns off, thus avoiding an undesirable and potentially damaging situation involving the simultaneous conduction of both transistors.

The integrated half-bridge timing control circuit described above is thus capable of efficiently driving a half-bridge output stage while minimizing power loss even at higher frequencies. This is accomplished in a circuit which avoids the use of large capacitors and sophisticated analog circuits, so that it can be easily integrated. Additionally, the duty cycle and period of the waveforms used to drive the output stage transistors can be easily selected, thus achieving flexible operation.

While the invention has been particularly shown and described with reference to several preferred embodiments, it will be understood by those skilled in the art that various changes in form and detail may be made without departing from the spirit and scope of the invention.

What is claimed is:

1. An integrated half-bridge timing control circuit for driving a half-bridge output stage having high-side and low-side power transistors coupled together at a high-voltage output terminal, which comprises:

a bistable circuit for generating a high-side timing control waveform and having set and reset inputs and an output coupled to a control terminal of said high-side power transistor;

a timing control circuit input;

a first delay circuit, coupled to the low side and having an input coupled to said timing control circuit input and an output;

a second delay circuit having an input and an output coupled to said bistable circuit set input;

a first interface circuit for coupling said first delay circuit output to said second delay circuit input;

a third delay circuit having an input and an output coupled to said bistable circuit reset input; and a second interface circuit for coupling said timing control circuit input to said third delay circuit input.

2. An integrated half-bridge timing control circuit as in claim 1, wherein said first delay circuit is a controllable delay circuit.

3. An integrated half-bridge timing control circuit as in claim 2, wherein said second and third delay circuits are fixed delay circuits.

4. An integrated half-bridge timing control circuit as in claim 3, further comprising a further bistable circuit for generating a low-side timing control waveform and having set and reset inputs and an output coupled to a control terminal of said low-side power transistor, said first delay circuit output being coupled to said further bistable circuit reset input, and a further delay circuit coupled between said timing control circuit input and said further bistable circuit set input.

5. An integrated half-bridge timing control circuit as in claim 4, wherein a delay of said further delay circuit is substantially equal to a sum of delays of said second and third delay circuits.

6. An integrated half-bridge timing control circuit as in claim 1, further comprising a gate driver circuit for coupling said bistable circuit output to said control terminal of said high-side power transistor.

7. An integrated half-bridge timing control circuit as in claim 1, wherein said bistable circuit comprises a latch circuit.

8. An integrated half-bridge timing control circuit as in claim 1, wherein said second and third delay circuits comprise digital delay circuits.

9. An integrated half-bridge timing control circuit as in claim 1, further comprising a further bistable circuit for generating a low-side timing control waveform and having set and reset inputs and an output coupled to a control terminal of said low-side power transistor, said first delay circuit output being coupled to said further bistable circuit reset input, and a further delay circuit coupled between said timing control circuit input and said further bistable circuit set input.

10. An integrated half-bridge timing control circuit as in claim 1, wherein said first and second interface circuits each comprise an inverter having a diode-coupled input section to decouple said inverter from a low side connection of the timing control circuit.

* * * * *